United States Patent [19]
Heinrich et al.

[11] Patent Number: 4,596,951
[45] Date of Patent: Jun. 24, 1986

[54] ELECTRONIC CIRCUIT FOR MEASURING AC ELECTRICAL ENERGY

[75] Inventors: Theodore M. Heinrich, Murrysville; Raymond W. Mackenzie, Baldwin, both of Pa.

[73] Assignee: Westinghouse Electric Corp., Pittsburgh, Pa.

[21] Appl. No.: 591,139

[22] Filed: Mar. 19, 1984

[51] Int. Cl.⁴ .................. G01R 21/06; G01R 21/127
[52] U.S. Cl. ...................................... 324/142; 324/74
[58] Field of Search ........................ 324/142, 74, 138; 364/483, 841, 842, 843

[56] References Cited
U.S. PATENT DOCUMENTS
4,456,878 6/1984 Gamoh ............................... 324/142

OTHER PUBLICATIONS
Hamburg, D. et al., "An Electronic Wattmeter . . . ", IEEE Trans. on Magnetics, Sep. 1971, vol. MAG-7, No. 3, pp. 438-442.
Mase, S., "High-Accuracy IC-Oriented AC Power Meter", Japan Electronic Engineering, No. 91, Jun. 1974, pp. 37-41.
Boghosian, D. et al., "A Novel Electronic Energy Meter Design", Third Int'l Conf. on Metering Appt. & Tariffs for Elect. Supp., London, England, Nov. 1977, pp. 252-255.

Primary Examiner—Jerry W. Myracle
Assistant Examiner—Stephen M. Baker
Attorney, Agent, or Firm—William D. Lanyi

[57] ABSTRACT

An improved circuit is provided for a solid state electrical energy meter having a pair of mutual inductance current transducers, a pulse width modulation circuit, an analog switch, and a voltage-to-frequency converter. The pulse width modulation circuit includes an integrator having a first operational amplifier with a feedback circuit providing a constant DC gain and a variable gain at the power frequency. The pulse width modulation circuit also includes a second operational amplifier configured as a comparator and connected to the first operational amplifier such that the reference level of the comparator is proportional to the average DC output of the first operational amplifier. The summing resistors connected to the input of the integrator are of like value and are formed in a common array.

9 Claims, 6 Drawing Figures

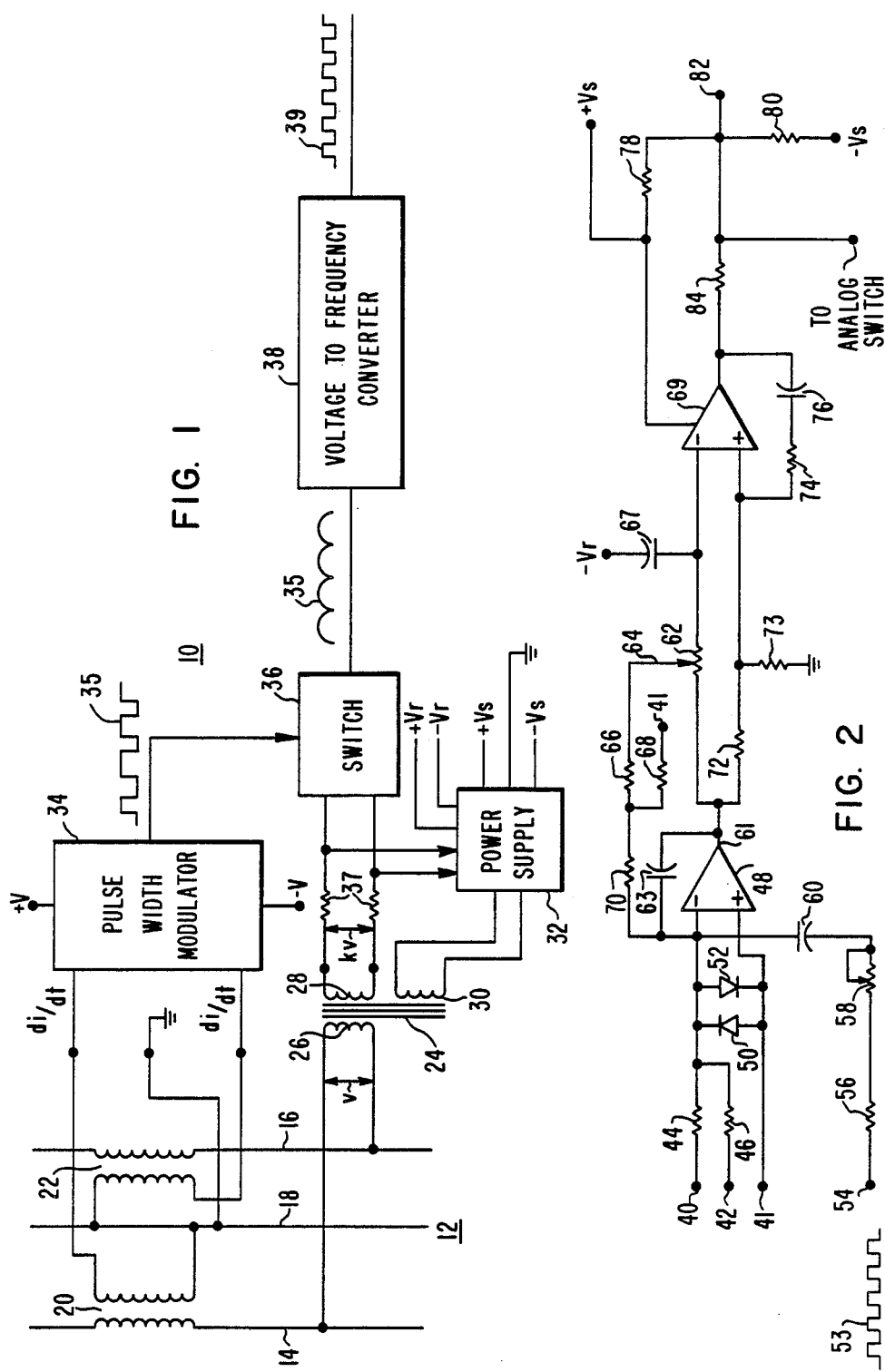

ELECTRONIC CIRCUIT FOR MEASURING AC ELECTRICAL ENERGY

BACKGROUND OF THE INVENTION

1. Field of the Invention

The invention relates to an electronic circuit for measuring AC electrical energy, and more particularly to an improved circuit using a current transducer which provides an analog signal that is responsive to the time derivative of the metered circuit current and a pulse width modulation circuit which produces a pulse width signal having a duty cycle that is proportional to the metered circuit current.

2. Description of the Prior Art

It is known in the art to provide electronic circuits for measuring AC electrical energy. One type of circuit uses a multiplier circuit to produce a signal which is responsive to the product of the current and voltage on the metered circuit, and a voltage-to-frequency converter to produce an output that is responsive to this product signal.

Various methods are known for producing the product signal. For example, U.S. Pat. No. 4,242,634 discloses an electronic meter using a variable-transconductance multiplier circuit. U.S. Pat. No. 4,254,376 discloses a circuit employing a pulse-width, pulse-height multiplier. A circuit employing a pulse width signal modulated with the metered circuit voltage is used to control a plurality of analog switches connected to a signal proportional to metered circuit current in U.S. Pat. No. 4,315,212. A related method is used in U.S. Pat. No. 4,182,983. In the patent, a pulse width signal is modulated with a quantity that is responsive to the metered circuit current. The pulse width modulated signal is used to control analog switches that are supplied with a quantity which is responsive to metered circuit voltage in order to produce a signal that is proportional to the power flowing through the metered circuit. The current responsive signal is produced by an integrator circuit connected to the output of a mutual conductance current transducer. This transducer provides an output signal which is proportional to the time derivative of the metered circuit current.

The apparatus described in the aforementioned U.S. Pat. No. 4,182,983 provides excellent performance over a variety of operating conditions. It would be desirable, however, to provide a circuit having improved temperature stability, noise immunity, and freedom from device offset voltage effects.

SUMMARY OF THE INVENTION

In accordance with the principles of the present invention there are provided an improved electronic circuit for the measurement of AC electrical energy which employs a mutual inductance current transducer to provide an output signal proportional to di/dt, the time derivative of the metered circuit current. This di/dt signal is summed with a square wave clock signal and provided through summing resistors as an input to an integrator.

The summing resistors of the integrator are of common value to reduce the temperature sensitivity of the circuit. For further improvement of temperature performance, the resistors may be formed on a common substrate in a semiconductor resistive array package.

The integrator comprises a first operational amplifier having its inverting input connected to the summation clock-di/dt signal. A fixed AC feedback circuit is provided between the output of the first operational amplifier and its inverting input. A variable DC feedback circuit is also provided between the same points. The output of the first operational amplifier of the integrator is provided to a comparator circuit comprising a second operational amplifier. The integrator output is connected through a first voltage divider to the non-inverting input of the comparator amplifier.

Since the operational amplifier of the integrator circuit provides a high DC gain, it will often exhibit a device offset voltage at the output thereof, causing the average output voltage of the integrator to depart substantially from the level of the circuit common. A resistance-capacitance filter, which is used to establish the comparator reference voltage as a function of the average integrator output voltage, compensates for the device offset voltage effect of the integrator.

The output of the comparator amplifier consists of a pulse width modulation signal, the duty cycle of which is proportional to the level of current in the metered circuit. This pulse width modulation (PWM) signal is used to control a plurality of analog switches which are supplied with a signal that is proportional to voltage on the metered circuit. The output of the switches is thus an analog signal which is proportional to the product of current, voltage and the cosine of their phase angle on the metered circuit. This product signal is then provided to a voltage-to-frequency converter to provide a pulse output signal proportional to electrical energy flowing through the metered circuit.

The signal proportional to the metered circuit voltage is provided by the secondary winding of a potential transformer, the primary of which is connected across the metered circuit. This potential transformer also includes a tertiary winding which provides input power to a power supply which, in turn, provides operating power for the entire apparatus. Through the use of a common potential transformer for both the sensing and power supply functions, the non-linear current-voltage relationship of the power supply cancels the non-linear current-voltage relationship of the potential transformer, thereby providing more linear performance of the entire apparatus.

In order to provide a more effective calibration adjustment for the power factor of the metered circuit, variable feedback is provided for the integrator. By providing the variable feedback in a high level low impedance part of the circuit, the DC gain of the integrator operational amplifier is not affected, thereby increasing the stability and performance of the circuit.

BRIEF DESCRIPTION OF THE DRAWINGS

FIG. 1 is a block diagram of an electronic watthour meter embodying the principles of the present invention;

FIG. 2 is a schematic diagram of the pulse width modulation circuit shown in FIG. 1;

DESCRIPTION OF THE PREFERRED EMBODIMENT

Figure 3:
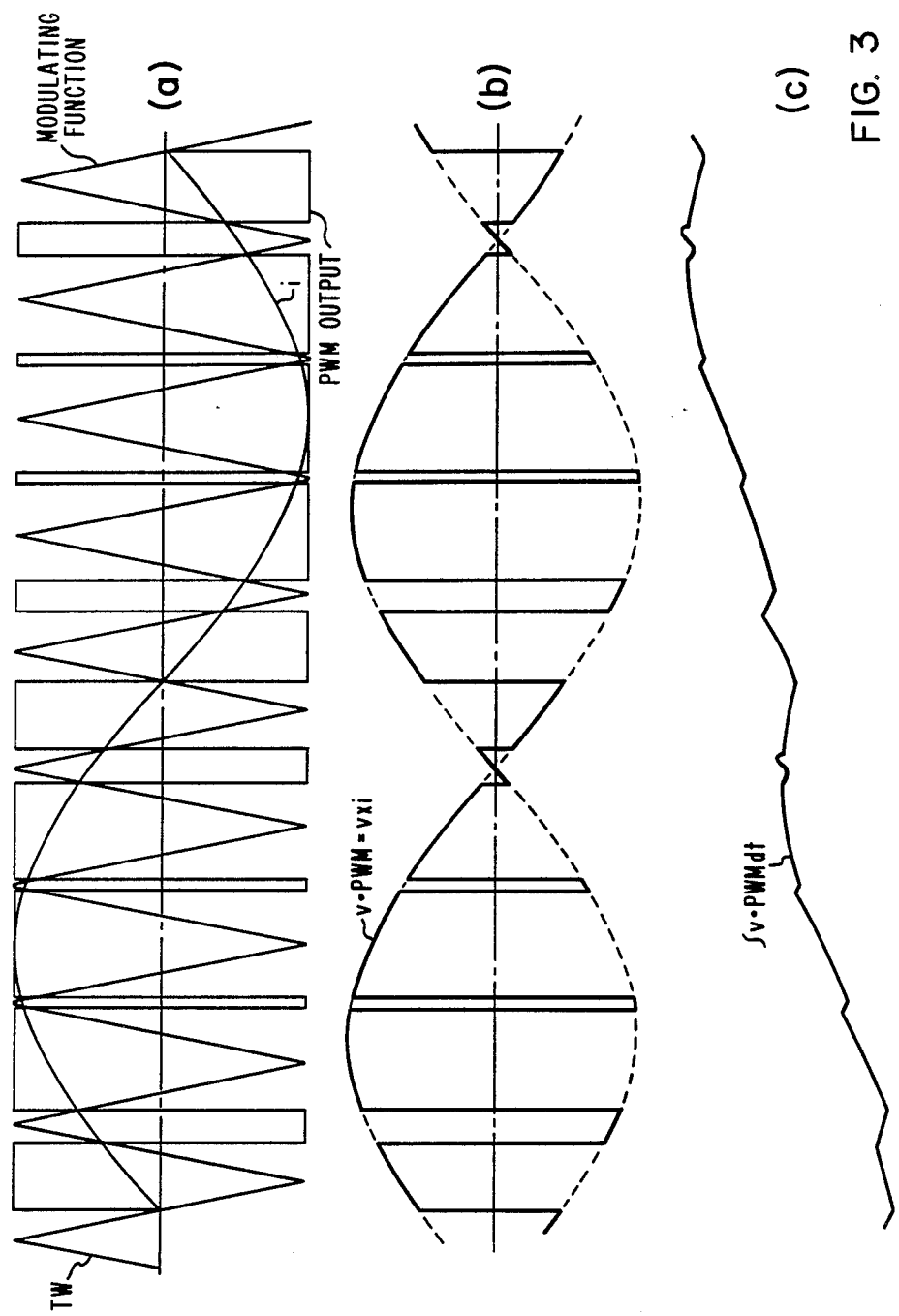
FIGS. 3(a)–(c) is a time graph of signals occurring in the circuit of FIG. 2.

Referring now to the Figures, FIG. 1 shows a block diagram of an electronic kilowatt-hour meter circuit 10 employing the principles of the present invention. The meter 10 is connected to provide a measure of electrical energy consumed on an electrical distribution circuit 12 including two phase conductors 14 and 16 and a neutral conductor 18.

The circuit 12 may represent a conventional electric power distribution circuit having a network frequency of 60 hertz and a typical maximum line current value of 200 amperes. The voltage on the metered circuit 12 typically has RMS values of 120 or 240 volts.

A pair of mutual inductance current transducers 20 and 22 are connected in series with the phase conductors 14 and 16, respectively. The transducers 20 and 22 provide an output signal, di/dt, that is proportional to the time derivative of the current flow i in the conductors 14 and 16. A transducer capable of producing such an output is disclosed in U.S. Pat. No. 4,368,424 issued to R. C. Miller.

A potential transformer 24 includes a primary winding 26 connected across the phase conductors 14 and 16 and a secondary winding 28 to provide an output voltage kv proportional to the voltage v across the phase conductors 14 and 16. The potential transformer 24 also includes a tertiary winding 30 which provides an input voltage to a power supply 32. The power supply 32 provides unregulated bipolar supply voltages $+V_S$ and $-V_S$ and regulated bipolar supply voltages $+V_r$ and $-V_r$. The supply voltages are used to provide operating power for the disclosed apparatus.

The output signals from the current transducers 20 and 22 are provided to a pulse width modulator circuit 34 where the two current derivative voltages are combined and used to produce a pulse width modulated output signal, the duty cycle of which is proportional to the line current on the metered circuit 12. The pulse width modulated (PWM) output signal 35 from the circuit 34 is provided as the control input to an analog switch circuit 36. The signal kv is also supplied as input through resistors 37 to the analog switch circuit 36 which, as a result of the control action of the PWM signal, provides a variable amplitude and variable pulse width signal 35 at the output of the analog switch circuit 36 which has an average or DC value proportional to the product of the line current and line voltage on the metered circuit.

This product signal is then supplied to the input of a voltage-to-frequency converter 38 which, in turn, produces an output signal consisting of a train of energy indicating pulses 39, each representing a quantized output of AC electrical energy on the metered circuit 12. Circuits and counting devices for accumulating and totalizing the pulses of the output signal of the voltage-to-frequency converter 38 to correspond to the total watt-hour consumption are well known.

Referring now to FIG. 2, a detailed description of the pulse width modulation circuit 34 will now be provided. The output signals from the secondaries of the current transducers (reference numerals 20 and 22 of FIG. 1) are connected to input terminals 40 and 42, respectively, of the PWM circuit 34. The other terminals of the secondaries of each of the current transducers are connected together, and to the circuit common at input terminal 41. The input terminals 40 and 42 are each connected to one terminal of like valued summing resistors 44 and 46, respectively, the other terminals of which are connected together and which are also connected to the inverting input of an operational amplifier 48. Also connected to the inverting terminal of the operational amplifier 48 are one terminal of each of a pair of back-to-back connected protective diodes 50 and 52, the other terminals of which are connected to the non-inverting terminal of the operational amplifier 48 and also to circuit common. The circuit common is not connected to ground, thus permitting the circuit common, or any of the supply potentials, to be connected to ground in the subsequent pulse counting and totalizing circuit.

At maximum line current on the metered circuit 12 of, for example, 200 amperes, the voltages applied to the summing resistors 44 and 46 may be on the order of 0.1 volts.

A square wave clock signal 53 at a frequency considerably higher than line frequency is provided to the PWM circuit 34 at input terminal 54. The clock signal may have a frequency of two KHz and a peak-to-peak amplitude of 12.8 volts, and may be produced by well known circuitry such as disclosed in the aforementioned U.S. Pat. No. 4,182,983. The input terminal 54 is connected to one terminal of a fixed summing resistor 56, the other terminal of which is connected to a potentiometer 58 connected as a variable resistor to provide a varying input level for the clock signal 53. The potentiometer 58 provides a calibration adjustment corresponding to the full load adjustment of conventional electromechanical rotating disk kilowatt-hour meters. It is an important feature of the present invention that the resistors 44, 46, and 56 have the same value and are preferably fabricated on a single substrate in, for example, a single in-line package array such as a type 750 manufactured by the CTS Corporation. In this manner, the resistors 44, 46, and 56 exhibit extremely similar temperature coefficients, thus providing stable performance of the PWM circuit 34 in a variety of operating environments.

The terminal of the calibration potentiometer 58 opposite the summing resistor 56 is connected through a coupling capacitor 60 to the inverting input of the operational amplifier 48, where the clock signal is summed with the current derivative signals provided by the current transducers (reference numerals 20 and 22 of FIG. 1).

The operational amplifier 48 is configured as an integrator by the provision of a feedback circuit between the output terminal 61 of the operational amplifier 48 and the inverting input thereof. The feedback circuit includes a capacitor 63 and a plurality of resistive components. As can be seen in FIG. 2, the output terminal 61 is connected to one fixed terminal of a potentiometer 62, the moving terminal 64 of which is connected to a resistor 66. The other terminal of the resistor 66 is connected to the junction of one terminal of a resistor 68 and one terminal of a resistor 70. The other end of the resistor 68 is connected to circuit common and the other end of the resistor 70 is connected to the inverting input of the operational amplifier 48. The other fixed terminal of the potentiometer 62 is connected, along with one terminal of a capacitor 67, to the inverting input of an operational amplifier 69.

The integrator circuit, including the operational amplifier 48, produces a first integrated signal having a triangular waveform in response to the integration of the square wave clock signal 53. A second integrated signal having a sine waveform is also produced by the integrator 48 in response to the di/dt signals provided by the input terminals 40 and 42. As is well known, the waveform of the line current on the circuit 12 is a sine wave, as is the derivative thereof produced by the transducers 20 and 22. The derivative process of the current transducers, however, produces a sine wave which is phase shifted 90° from the waveform of the line current i. This phase shift is reversed by the integrator including the operational amplifier 48 which produces, as its output, a sine wave having a phase and shape identical to the line current on the circuit 12.

The integration operation performed by the operational amplifier 48 causes the output signal to have a triangular waveform superimposed on the signal having the sine waveform. The integration of the summation of a di/dt signal and a square wave results in the summation of a triangular signal and a sinusoidal current signal. The triangular waveform then rides upon the sine waveform and oscillates about a level which rises and falls with the amplitude of the sine waveform.

The superimposed signal is provided to the non-inverting input of the operational amplifier 69 through a resistive voltage divider comprising the resistors 72 and 73. A feedback circuit, comprising a series-connected resistor 74 and capacitor 76, is connected between the output of the operational amplifier 69 and the non-inverting input thereof. The resistor 74 and capacitor 76 provide positive feedback for the operational amplifier 69, thus configuring it as a comparator. The operational amplifier 69 will provide a positive signal at its output whenever the voltage at the non-inverting terminal is above a reference voltage applied to the inverting terminal thereof, and will provide a negative output signal when the voltage at the non-inverting input falls below the voltage at the inverting input. The voltage at the inverting input thus constitutes a reference voltage for the operational amplifier 69 which is configured as a comparator.

It is considered an important feature of the present invention that the reference voltage at the inverting input of the operational amplifier 68 is not set by a fixed supply voltage, but is rather provided by the average DC level of the voltage appearing at the output terminal 61 of the integrator operational amplifier 48. This is accomplished by the potentiometer 62 and capacitor 67 which act as an RC filter to provide a path to ground for the AC signal passing through the potentiometer 62. In this manner, any device offset voltage appearing at the input of the integrator operational amplifier 48 which causes the average voltage at the output terminal 61 to depart from circuit common voltage will not affect the level of AC signal voltage which causes the comparator 69 to switch.

As can be seen, the potentiometer 62 provides for an adjustable feedback circuit between the output terminals 61 and inverting terminal of the integrator operational amplifier 48. The purpose of this adjustment is to provide a phase adjustment for the apparatus 10 to accommodate a variety of power factors on the metered circuit 12. Although the potentiometer 62 provides a variable feedback path for the operational amplifier 48, the DC gain of the operational amplifier remains constant. This is accomplished in the following manner. As can be seen from FIG. 2, the AC component of the voltage at the output terminal 61 is provided with a path to circuit common through the capacitor 67 and the negative regulated reference voltage supply of the power supply (reference numeral 32 in FIG. 1). Thus, there is current flow through the resistive portion of the potentiometer 62, causing an AC voltage drop to appear across the terminals thereof. Variation of the position of the movable terminal of the potentiometer 62 will thus cause a varying amount of AC feedback, which in turn will vary the phase response of the operational amplifier 48. The DC component of the output voltage of the operational amplifier 48 is not similarly affected. It is blocked from returning to circuit common through the high DC impedance of the capacitor 67. Similarly, the inverting input of the operational amplifier 69 provides an extremely high impedance. Accordingly, there is negligible DC current flow through the potentiometer 62 and a correspondingly negligible DC voltage drop across it. Furthermore, in a specific embodiment of the present invention, the maximum resistance of the potentiometer 62 can be chosen to be only 50 Kohms which appears in series with resistor 66 which can be chosen to be as large as 1 megohm, for example. Thus, a variation of the movable terminal of the potentiometer 62 would result in a negligible affect upon the DC current flow.

The reference voltage appearing at the inverting input of the operational amplifier 69 is determined by the voltage appearing at the output of the operational amplifier 48. The potentiometer 62, resistor 66, and resistor 68 form a voltage divider, the intermediate terminal of which is connected to the inverting input of the operational amplifier 69. A similar voltage divider is formed by the resistors 72 and 73, an intermediate terminal of which is connected to the non-inverting input of the operational amplifier 69. The values of the resistors 70, 73, 66, 68, 72, and potentiometer 62 are chosen such that the dividing ratios of the previously described voltage dividers are approximately equal for DC signals. As stated previously, the AC component of the output signal present at the terminal 61 of the operational amplifier 48 is bypassed to circuit common for the inverting input of the operational amplifier 69 by the capacitor 67, whereas most of the AC signal appears across the resistor 73, thus being supplied to the non-inverting input of the comparator operational amplifier 69 as the signal input thereto.

As can be seen, the non-regulated supply voltages $+V_S$ and $-V_S$ are connected to resistors 78 and 80 to set the DC level of the output signal appearing at output terminal 82 from the output terminal of the comparator operational amplifier 69 through a resistor 84.

The waveforms appearing in the pulse width modulator circuit 34 are shown in FIG. 3. As can be seen, the output of the integrator operational amplifier 48 includes a sine waveform i that is proportional to current in the circuit 12 along with a triangular waveform TW which is the integration of the clock signal 53. The triangular waveform is superimposed on the sine wave, thereby producing a variable duty cycle pulse signal at the output of the comparator operational amplifier 69. When the current signal is at a high level, the duty cycle of the pulse output is such that the majority of the signal time occurs at the positive level. As the amplitude of the sine current waveform decreases, the percentage of pulse output signal at the negative level increases. The signal provided at the output terminal 82 of the circuit 34 is thus a variable duty cycle pulse signal modulated by the amplitude of current in the metered circuit 12.

The output signal from the circuit 34 is used to control an analog switch circuit 36 which is supplied with the signal kv proportional to the voltage on the metered circuit 12. Whenever the waveform of the PWM signal is positive, the voltage signal kv is supplied at the output of the circuit 36. That is, the switch is closed. When the waveform of the PWM signal from the circuit 34 is negative, the switch of the circuit 36 is opened, thus blocking the voltage signal kv from the output of the circuit 36. Accordingly, the waveform at the output of the switch circuit 36 is as shown in FIG. 3, (b). The average DC level of the output waveform of the switch circuit 36 is thus proportional to the product of the current and the voltage on the metered circuit 12. The product signal is then supplied to the voltage-to-frequency converter circuit 38, which may be of any suitable type, such as that disclosed in the aforementioned U.S. Pat. No. 4,182,983. The output of the voltage-to-frequency converter 38 is thus a train of pulses, each of which is indicative of the consumption of a predetermined quantum of electrical energy through the metered circuit 18. As the energy consumption increases, the frequency of pulses at the output of the circuit 38 similarly increases. The pulses are then accumulated and totalized in a well known manner to provide an indication, as shown in FIG. 3, (c), of kilowatt-hours consumed on the metered circuit 12.

Figure 4:
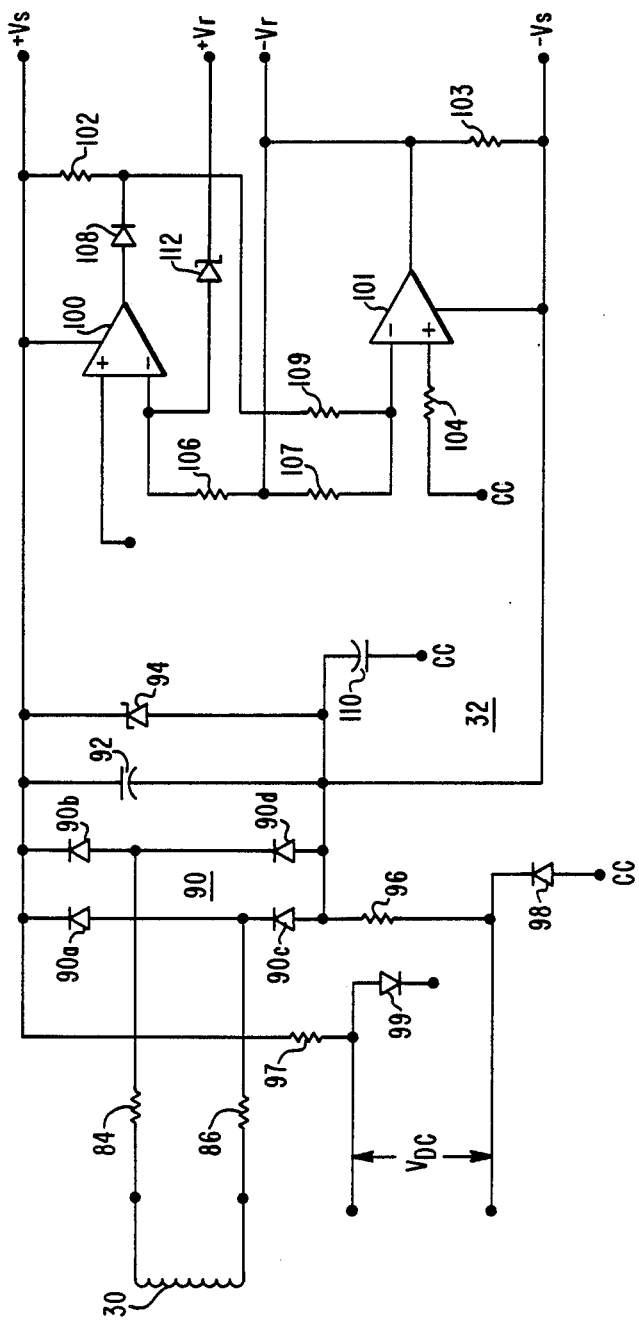
FIG. 4 is a schematic diagram of the power supply shown in FIG. 1.

The power supply 32 is shown in more detail in FIG. 4. As can be seen, an input signal from the tertiary winding 30 of the potential transformer 24 (as also shown in FIG. 1) is supplied through limiting resistors 84 and 86 to a full wave bridge rectifier 90. The current limiting resistance is provided in part by resistors 84 and 86, and in part by the winding resistance of the tertiary winding 30. A filter capacitor 92 and shunt zener diode preregulator 94 are connected across the output of the bridge rectifier 90. A bipolar loosely regulated supply producing voltage V, is formed from the output of the bridge rectifier by center tapping through ground via a pair of like valued balancing resistors 96 and 97. The low voltage end of each of the balancing resistors, 96 and 97, is connected to circuit common through biasing diodes 98 and 99 which serve to bias a series of protective diodes provided at the output of the potential transformer secondary winding 28.

A regulated power supply voltage $V_r$ is provided by a pair of operational amplifiers, 100 and 101, and associated circuitry which provide a bipolar regulated output voltage $V_r$ and $-V_r$ in a conventional manner.

The non-inverting input of operational amplifier 100 is connected to circuit common. The output of operational amplifier 100 is connected to one terminal of diode 108 and the other terminal of diode 108 is connected to a terminal of resistor 102. Resistor 102 is connected between the diode 108 and $+V_S$ unregulated bipolar supply voltage output of the power supply 32. Diode 108 is also connected directly to the $+V_r$ regulated output of the power supply 32. The inverting inputs of both operational amplifiers, 100 and 101, are connected to $-V_r$, the negative regulated voltage output of the power supply 32, through like valued resistors, 106 and 107, as shown. The inverting input of operational amplifier 100 is also connected to a zener diode 112 which is, in turn, connected to the $+V_r$ regulated voltage output of the power supply 32. The non-inverting input of operational amplifier 101 is connected, through resistor 104, to the circuit common CC and its output is connected, through resistor 103, to $-V_S$, the unregulated negative voltage output of the power supply 32.

As can be seen from FIG. 4, diode 98, capacitor 110, the non-inverting input of operational amplifier 100 and resistor 104 are connected to circuit common CC.

Component values which are illustrated in FIGS. 1, 2 and 4 and discussed above in relation to the block diagram of the electronic watt-hour meter, the pulse width modulator and the power supply of the present invention are shown in Table I. It should be understood that, although specific component values are shown in Table I, alternative embodiments of the present invention could utilize compounds with different values and, therefore, the present invention is not limited to the use of these particular components.

TABLE I

| Component | Value |
| --- | --- |
| 44 | 47KΩ |
| 46 | 47KΩ |
| 48 | Type TL083 |
| 50 | Type IN4148 |
| 51 | Type IN4148 |
| 56 | 47KΩ |
| 58 | 5KΩ |
| 60 | .022 mf |
| 62 | 50KΩ |
| 63 | .01 mf |
| 66 | 1 MΩ |
| 67 | 6.8 mf |
| 68 | 133KΩ |
| 69 | Type LM293 |
| 70 | 1 MΩ |
| 72 | 51KΩ |
| 73 | 2.2 MΩ |
| 74 | 1 MΩ |
| 76 | 3 pf |
| 84 | 56Ω |
| 86 | 56Ω |
| 90 | a,b,c,d Type IN4148 |
| 92 | 330 mf |
| 94 | Type IN970 |
| 96 | 22KΩ |
| 97 | 22KΩ |
| 98 | Type IN4148 |
| 99 | Type IN4148 |
| 100 | Type LM1558 |
| 101 | Type LM1558 |
| 102 | 3.9KΩ |
| 103 | 3.9KΩ |
| 104 | 3KΩ |
| 106 | 6.19KΩ |
| 107 | 6.19KΩ |
| 108 | Type IN4142 |
| 109 | 6.19KΩ |
| 110 | 0.1 mf |
| 112 | Type IN4572 |

Although the present invention has been described with particular specificity regarding a preferred embodiment, it should be understood that alternative embodiments are to be considered within the scope of the present invention.

We claim:

1. An electronic circuit for measuring electrical energy on a metered circuit, comprising:

current input means for producing an input signal proportional to the time derivative of the current in the metered circuit;

means for producing a square wave clock signal at a constant frequency;

integrating means connected to said current input means and said clock signal means for producing a signal that is proportional to the sum of the time integrals of said input signal and said clock signal;

means connected to said integrating means for producing a pulse width modulation signal modulated by a quantity that is proportional to the current in the metered circuit;

a switching circuit having its input connected to a signal that is proportional to voltage on the metered circuit and controlled by said pulse width modulation signal for producing an output which is proportional to the product of the voltage and current in the metered circuit; and a voltage-to-frequency converter for producing a pulse output signal having a frequency proportional to said product signal;

said integrating means comprising a first operational amplifier having a feedback circuit providing a constant impedance for direct current and a variable impedance at the frequency of the current in the metered circuit;

said pulse width modulation producing means comprising a second operational amplifier; and said feedback circuit comprising a potentiometer having a first fixed terminal connected to the output of said first operational amplifier, a second fixed terminal connected to a first input of said second operational amplifier and a movable terminal coupled to a first input of said first operational amplifier.

2. Apparatus as recited in claim 1 comprising a first resistive voltage divider having one end terminal connected to the output of said first operational amplifier, another end terminal connected to circuit common and an intermediate terminal connected to a second input of said second operational amplifier, said apparatus further comprising a resistance element connected between said potentiometer movable terminal and circuit common such that said potentiometer second fixed terminal constitutes the intermediate terminal of a second resistive voltage divider; and said potentiometer, said resistance element, and said first resistive voltage divider having values such that said first and second resistive voltage dividers have equal direct current divider ratios at the intermediate terminals thereof.

3. An electronic circuit for measuring electrical energy on a metered circuit, comprising:

current input means for producing an input signal that is proportional to the time derivative of the current in the metered circuit;

means for producing a square wave clock signal at a constant frequency;

first integrating means connected to said current input means and said clock signal means for producing a signal that is proportional to the sum of the time integrals of said current input means and said clock signal;

means connected to said first integrating means for producing a pulse width modulation signal modulated by a quantity that is proportional to the current in the metered circuit, said pulse width modulation means comprising a comparator having a signal input terminal, a reference terminal isolated from fixed reference voltages, and an output terminal, said input terminal being supplied with said summation integral signal, said pulse width modulation means also comprising means for establishing a reference signal proportional to the average DC level of said summation integral signal;

a switching circuit having its input connected to a signal proportional to voltage on the metered circuit and controlled by said pulse width modulation signal for producing an output proportional to the product of the voltage and current in the metered circuit;

a volage-to-frequency converter for producing a pulse output signal having a frequency proportional to said product signal;

said reference establishing means comprising a pair of resistive voltage dividers having generally equal DC divider ratios, one end of both dividers being connected to said integrating means output, the other end of both dividers being connected to circuit common and the intermediate terminal of each divider being connected to a separate one of said comparator means inputs.

4. Apparatus as recited in claim 3 wherein said integrator means comprises a first operational amplifier and said pulse width modulation means comprises a second operational amplifier.

5. An electronic circuit for measuring electrical energy on a metered circuit, comprising:

current input means for producing an input signal proportional to the time derivative of the current in the metered circuit;

means for producing a square wave clock signal at a constant frequency;

integrating means connected to said current input means and said clock signal means for producing a signal that is proportional to the sum of the time integrals of said input signal and said clock signal;

means connected to said integrating means for producing a pulse width modulation signal modulated by a quantity that is proportional to the current in the metered circuit;

a switching circuit having its input connected to a signal that is proportional to voltage on the metered circuit and controlled by said pulse width modulation signal for producing an output which is proportional to the product of the voltage and current in the metered circuit; and a voltage-to-frequency converter for producing a pulse output signal having a frequency proportional to said product signal;

said integrating means comprising a first operational amplifier having a feedback circuit providing a constant impedance for direct current and a variable impedance at the frequency of the current in the metered circuit;

said producing means comprising a second operational amplifier and said feedback circuit comprising a potentiometer having a first fixed terminal connected to the output of said first operational amplifier, a second fixed terminal being being connected to a first input of said second operational amplifier, and a movable terminal being coupled to a first input of said first operational amplifier; and said apparatus further comprising a reactive element connected between said second operational amplifier first input and circuit common.

6. Apparatus as recited in claim 5 wherein said reactive element comprises a capacitor.

7. Apparatus as recited in claim 6 comprising a first resistive voltage divider having one end terminal connected to the output of said first operational amplifier, another end terminal connected to circuit common and an intermediate terminal connected to a second input of said second operational amplifier, said apparatus further comprising a resistance element connected between said potentiometer movable terminal and circuit common such that said potentiometer second fixed terminal constitutes the intermediate terminal of a second resistive voltage divider; and said potentiometer, said resistance element, and siad first resistive voltage divider having values such that said first and second resistive voltage dividers have generally equal direct current divider ratios at the intermediate terminals thereof.

8. An electronic circuit for measuring electrical energy on a metered circuit, comprising:

current input means for producing an input signal that is proportional to the time derivative of the current in the metered circuit;

means for producing a square wave clock signal at a constant frequency;

first integrating means connected to said current input means and said clock signal means for producing a signal that is proportional to the sum of the time integrals of said current input means and said clock signal;

means connected to said first integrating means for producing a pulse width modulation signal modulated by a quantity that is proportional to the current in the metered circuit, said pulse width modulation means comprising a comparator having a signal input terminal, a reference terminal isolated from fixed reference voltages, and an output terminal, said input terminal being supplied with said summation integral signal, said pulse width modulation means also comprising means for establishing a reference signal proportional to the average DC level of said summation integral signal;

a switching circuit having its input connected to a signal proportional to voltage on the metered circuit and controlled by said pulse width modulation signal for producing an output signal proportional to the product of the voltage and current in the metered circuit;

a voltage-to-frequency converter for producing a pulse output signal having a frequency proportional to said product signal; and said reference establishing means comprising a pair of resistive voltage dividers having equal DC divider ratios, one end of both dividers being connected to said integrating means output, the other end of both dividers being connected to circuit common, and the intermediate terminal of each divider being connected to a separate one of said comparator means inputs.

9. Apparatus as recited in claim 8 wherein said integrator means comprises a first operational amplifier and said pulse width modulation means comprises a second operational amplifier.

* * * * *